(12) United States Patent
Daubenspeck et al.

(10) Patent No.: US 9,613,921 B2
(45) Date of Patent: Apr. 4, 2017

(54) STRUCTURE TO PREVENT SOLDER EXTRUSION

(71) Applicant: INTERNATIONAL BUSINESS MACHINES CORPORATION, Armonk, NY (US)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 277 days.

(21) Appl. No.: 14/057,649

(22) Filed: Oct. 18, 2013

(65) Prior Publication Data
US 2015/0108642 A1 Apr. 23, 2015

(51) Int. Cl.
*H01L 23/00* (2006.01)
*H01L 21/56* (2006.01)
*H01L 23/31* (2006.01)

(52) U.S. Cl.
CPC .......... *H01L 24/11* (2013.01); *H01L 23/3142* (2013.01); *H01L 24/13* (2013.01); *H01L 21/563* (2013.01); *H01L 23/3114* (2013.01); *H01L 24/03* (2013.01); *H01L 24/05* (2013.01); *H01L 2224/0345* (2013.01); *H01L 2224/03614* (2013.01); *H01L 2224/03912* (2013.01); *H01L 2224/0401* (2013.01); *H01L 2224/051* (2013.01); *H01L 2224/05009* (2013.01); *H01L 2224/05022* (2013.01); *H01L 2224/0558* (2013.01); *H01L 2224/05147* (2013.01); *H01L 2224/05155* (2013.01);
(Continued)

(58) Field of Classification Search
CPC ......... H01L 24/11; H01L 24/19; H01L 24/20; H01L 23/314; H01L 23/315; H01L 24/03–24/04; H01L 23/11; H01L 23/13
See application file for complete search history.

(56) References Cited

U.S. PATENT DOCUMENTS 6,590,295 B1 7/2003 Liao et al.
6,743,660 B2 6/2004 Lee et al.
(Continued)

OTHER PUBLICATIONS

"Solder Wetting in a Wafer-Level Flip Chip Assembly", 2001 IEEE, Electronic Components and Technology Conference.*
(Continued)

*Primary Examiner* — Bilkis Jahan
*Assistant Examiner* — Nga Doan
(74) *Attorney, Agent, or Firm* — David Cain; Andrew M. Calderon; Roberts Mlotkowski Safran Cole & Calderon, P.C.

(57) ABSTRACT

A spacer structure formed adjacent a solder connection which prevents solder extrusion and methods of manufacture are disclosed. The method includes forming a solder preform connection on a bond pad of a chip. The method further includes forming a spacer structure on sidewalls of the solder preform connection. The method further includes subjecting the solder preform connection to a predetermined temperature to form a solder connection with the spacer structure remaining thereabout.

17 Claims, 8 Drawing Sheets

(52) U.S. Cl.
CPC ............... *H01L 2224/05166* (2013.01); *H01L 2224/05572* (2013.01); *H01L 2224/05647* (2013.01); *H01L 2224/10126* (2013.01); *H01L 2224/1134* (2013.01); *H01L 2224/1147* (2013.01); *H01L 2224/11462* (2013.01); *H01L 2224/11827* (2013.01); *H01L 2224/11831* (2013.01); *H01L 2224/11849* (2013.01); *H01L 2224/13017* (2013.01); *H01L 2224/13022* (2013.01); *H01L 2224/13111* (2013.01); *H01L 2224/13565* (2013.01); *H01L 2224/13686* (2013.01); *H01L 2224/16225* (2013.01); *H01L 2224/16227* (2013.01); *H01L 2224/32225* (2013.01); *H01L 2224/73204* (2013.01); *H01L 2224/81191* (2013.01); *H01L 2224/83104* (2013.01); *H01L 2924/3841* (2013.01)

(56) References Cited

U.S. PATENT DOCUMENTS

| | | |
|---|---|---|
| 6,756,184 B2 | 6/2004 | Peng et al. |
| 6,913,946 B2 | 7/2005 | Lin |
| 7,501,708 B2 | 3/2009 | Andry et al. |
| 7,906,425 B2 | 3/2011 | Su et al. |
| 8,237,279 B2 | 8/2012 | Daubenspeck et al. |
| 8,298,930 B2 | 10/2012 | Arvin et al. |
| 2003/0001283 A1* | 1/2003 | Kumamoto ........... H01L 21/563 257/778 |
| 2000/6007667 | 4/2006 | Daubenspeck |
| 2006/0278982 A1* | 12/2006 | Solo De Zaldivar ... H01L 24/11 257/737 |
| 2010/0109052 A1* | 5/2010 | Nakajima et al. ............ 257/197 |
| 2010/0165585 A1* | 7/2010 | Lin ....................... H01L 23/642 361/748 |
| 2011/0006422 A1 | 1/2011 | Daubenspeck et al. |
| 2011/0233761 A1* | 9/2011 | Hwang ................... H01L 24/03 257/737 |
| 2011/0285011 A1* | 11/2011 | Hwang ................... H01L 24/11 257/737 |
| 2011/0298123 A1* | 12/2011 | Hwang et al. ................ 257/737 |
| 2012/0083114 A1 | 4/2012 | Perfecto et al. |
| 2012/0139113 A1* | 6/2012 | Arvin ..................... H01L 24/11 257/751 |
| 2012/0280388 A1* | 11/2012 | Wu .................. H01L 21/76852 257/737 |
| 2014/0021522 A1* | 1/2014 | Lin et al. ...................... 257/299 |

OTHER PUBLICATIONS

"Novel Jet Fluxing Application for Advanced Flip Chip and BGA/CGA Packages", 2000 IEEE, Electronic Components and Technology Conference.*

IBM, "Copper Pillar Sidewall Wetting Prevention—Structure and Process", IPCOM000182402D, Apr. 20, 2009, 6 pages.

Unknown, "PbFree C4/BLM with Annular Oxide Ring for Dimensional Control and Reliability," IPCOM, Apr. 9, 2009, 6 pages.

* cited by examiner

STRUCTURE TO PREVENT SOLDER EXTRUSION

FIELD OF THE INVENTION

The invention relates to semiconductor structures and, more particularly, to a spacer structure formed adjacent a solder connection which prevents solder extrusion and methods of manufacture.

BACKGROUND

As on-chip dimensions decrease, the dimensions of the solder connections connecting the chip to the package must also decrease. For small solder connection spacing (e.g., 100 um or less), there is a risk of neighboring solder connections, e.g., solder bumps, shorting together. This is especially likely if there is poor adhesion between the underfill and the on-chip passivation (polyimide). For example, adhesion loss at the underfill-polyimide interface often occurs at the edge of solder bumps, which can lead to delamination and formation of small voids. This weak adhesion is due to a contamination of the polyimide surface by the solder or due to a pre-existing void associated with the undercut of the ball limiting metallization (BLM) structure.

During subsequent reflow of the solder connections, molten solder can get pushed into the voids. These solder extrusions have been related to fails due to shorts. For example, solder extrusions have been observed in high density corners or at high density edges. In fact, yield loss has been found to be up to about 5%.

SUMMARY

In an aspect of the invention, a method comprises forming a solder preform connection on a bond pad of a chip. The method further comprises forming a spacer structure on sidewalls of the solder preform connection. The method further comprises subjecting the solder preform connection to a predetermined temperature to form a solder bump with the spacer structure remaining thereabout.

In an aspect of the invention, a method comprises forming a ball metallization structure in contact with an underlying bond pad exposed through a via of a passivation layer. The method further comprises forming a solder preform connection on the ball metallization structure. The method further comprises forming spacer material on the solder preform connection. The method further comprises forming a spacer structure on sidewalls of the solder preform connection by removing portions of the spacer material from an upper surface of the solder preform connection and upper portions of the sidewalls of the solder preform connection. The method further comprises forming a solder bump from the solder preform connection with the spacer structure remaining thereabout.

In an aspect of the invention, a structure comprises: a ball metallization structure in contact with an underlying bond pad exposed through a via of a passivation layer; a solder bump positioned directly on the ball metallization structure; and a spacer structure in direct contact with the ball metallization structure and on the solder bump about a perimeter thereof.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structure of the present invention. In still further embodiments, a method in a computer-aided design system is provided for generating a functional design model of the structure of the present invention. The method comprises generating a functional representation of the structural elements of the structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
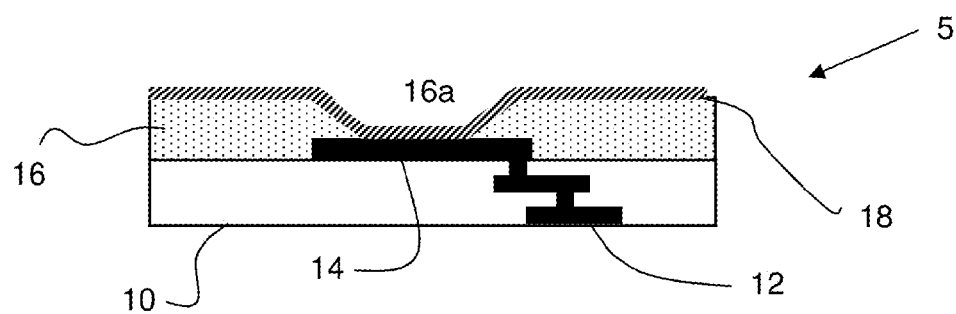
FIGS. 1-6 show processing steps and respective structures in accordance with aspects of the present invention.

The invention relates to semiconductor structures and, more particularly, to a spacer structure formed adjacent a solder connection which prevents solder extrusion, and methods of manufacture. More specifically, the present invention comprises a spacer structure which prevents shorting of adjacent solder connections due to solder extrusion, e.g., caused by adhesion loss between an underfill and final passivation of a chip package. In embodiments, the spacer structure is a sidewall spacer provided adjacent to a solder connection, e.g., solder bump. The spacer structure can be, for example, $SiO_2$ or SiN, formed using different manufacturing processes, resulting in different configurations. For example, the spacer structure can be formed before or after BLM patterning. Advantageously, the sidewall spacer of the present invention is self aligned to both the solder connection and an underlying ball limiting metallization (BLM), thus eliminating fabrication processes.

In embodiments, the spacer structure comprises $SiO_2$ or SiN formed around the perimeter of the solder connection. In more specific embodiments, the spacer structure extends only a partial height of the solder connection, e.g., about 1 μm, and, advantageously, provides improved adhesion of the underfill to the chip at the base of the solder ball. For example, the spacer structure pinches-off a void associated with an undercut of a ball limiting metallization (BLM) or by covering up contaminated polyimide at the base of the solder connection. The void pinch-off will prevent solder extrusions and hence shorting of adjacent solder connections.

By way of an illustrative non-limiting example, a method of forming the spacer structure comprises forming a spacer structure around the base of a solder connection preform. The spacer structure can be formed by a blanket deposition of nitride or oxide based material, prior to or after patterning of the solder pad (BLM structure). The nitride or oxide based material can be patterned, prior to reflowing the solder connection preform, resulting in a sidewall structure of about 1 μm; although other dimensions are also contemplated by the present invention. The solder connection preform can then be reflowed, resulting in the spacer structure provided adjacent to the solder connection.

The fabrication of structures of the present invention can be manufactured in a number of ways using a number of different tools. In general, the methodologies and tools are used to form small structures with dimensions in the micrometer scale. The methodologies, i.e., technologies, employed to manufacture semiconductor devices of the present invention have been adopted from integrated circuit (IC) technology. For example, the structures of the present invention are built on wafers and are realized in films of material patterned by photolithographic processes on the top of a wafer. In particular, the fabrication of the semiconductor devices uses basic building blocks, including: (i) deposition of films of material on a substrate, (ii) applying a patterned mask on top of the films by photolithographic imaging, (iii) etching the films selectively to the mask; and (iv) packaging of the integrated circuits to a laminate structure.

FIGS. 1-6 show processing steps and respective structures in accordance with aspects of the present invention. More specifically, FIG. 1 shows a structure 5 comprising a chip 10. In embodiments, the chip 10 can include, for example, a number of wiring layers with active and passive components as represented by reference numeral 12. The active components can be, for example, transistors, diodes, etc.; whereas, the passive components can be, for example, wiring, vias, resistors, etc. The active and passive components 12 can be manufactured in accordance with well known CMOS fabrication techniques as described herein.

Still referring to FIG. 1, a bond pad 14 is formed on an upper surface of the chip 10, surrounded by a final passivation layer 16. In embodiments, the bond pad 14 can be, for example, any metal or metal alloy layer formed using deposition, lithography and etching processes. The final passivation layer 16 can be, for example, PSPI (Photosensitive Polyimide) or other known passivation layers.

Illustratively, the bond pad 14 can be formed by either a subtractive or additive process, well known to those of skill in the art. By way of explanation, in a subtractive method, a metal layer can be deposited on the upper surface of the chip 10 using a physical vapor deposition (PVD) process. The metal layer is then be patterned by forming a resist on the metal layer, exposing the resist to energy (light) to form openings (patterns), and performing a reactive ion etch (RIE) through the openings to form the bond pad 14. Any excess resist can be removed by an oxygen ashing process. The final passivation layer 16 can then be blanket deposited on the bond pad 14 and exposed portions of the chip 10 using conventional chemical vapor deposition (CVD) processes.

FIG. 1 further shows a via 16a formed in the final passivation layer 16 using conventional lithography and etching processes. The via 16a exposes the underlying bond pad 14. A BLM structure 18 (e.g., one or more metallization layers) is formed in via 16a, in contact with the underlying bond pad 14 and over the exposed portions of the passivation layer 16. The BLM structure 18 can be a multilayer structure including, for example, TiW and Cu/Ni/Cu, formed using conventional deposition methods, e.g., PVD, lithography and etching processes (patterning processes). In embodiments, the BLM structure 18 can be other materials; although an upper copper layer is known to provide improved wetting characteristics for the solder connection.

Figure 2:
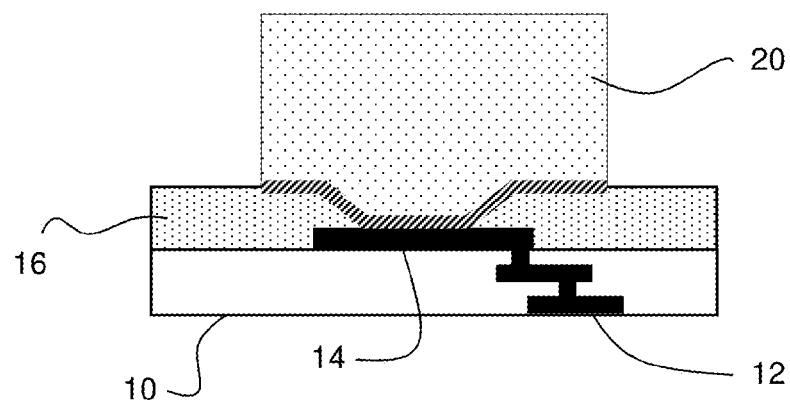

FIG. 2 shows a solder connection preform 20 formed on the BLM structure 18. In embodiments, a resist is formed on the BLM structure 18 and patterned by exposure to energy (light). A solder connection material, e.g., solder connection preform 20, is formed within the patterned resist. The solder connection material can be formed to a height of about 50 μm; although other dimensions are also contemplated by the present invention. The solder connection material can be, for example, a lead free material such as tin of tin alloys formed using conventional electroplating techniques. Once the solder connection preform 20 is formed, the resist is removed using an oxygen ashing process, as one example. Any exposed BLM structure is also removed by a selective etching process. The selective removal of the BLM structure will expose a surface of the passivation layer 16.

Figure 3:
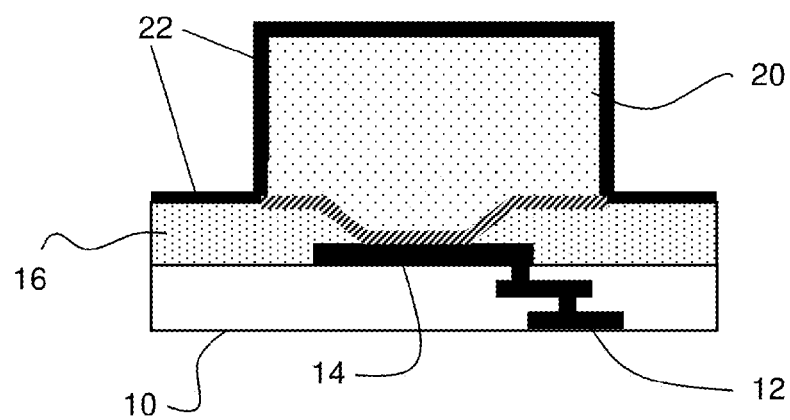

In FIG. 3, a sidewall material 22 can be formed on the solder connection preform 20 and any exposed portions of the passivation layer 16. In embodiments, the sidewall material can be deposited using conventional CVD processes, which is a blanket deposition of the material on the sidewall(s) and upper surface of the solder connection preform 20, in addition to any other exposed surfaces. In more specific embodiments, the sidewall material 22 is a low temperature deposition of $SiO_2$ or SiN. The sidewall material 22 can be deposited to a thickness of about 50 nm to about 500 nm; although other dimensions are also contemplated by the present invention.

Figure 4:
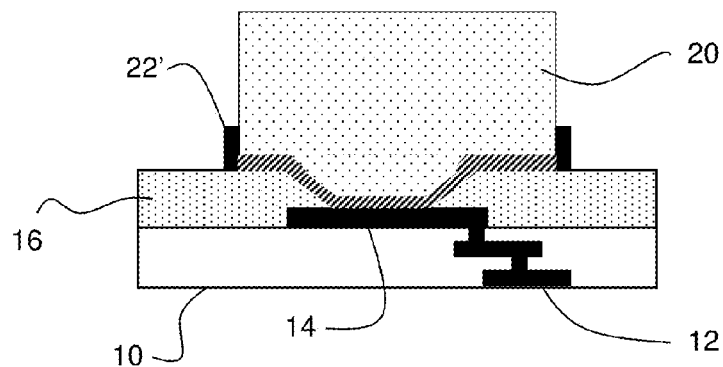

In FIG. 4, the sidewall material is partially removed to form sidewall spacers 22'. In embodiments, the sidewall material is removed using an anisotropic etching process, prior to reflow of the solder connection preform 20. For example, the anisotropic etching process will remove the sidewall material from all horizontal surfaces, e.g., horizontal surface of the solder connection preform 20 and passivation layer 16, and partially from the vertical surface of the solder connection preform 20. Depending on the etch time, the sidewall material will be removed from the vertical sidewalls of the solder connection preform 20 by a certain amount. In embodiments, the etching process will result in a sidewall spacer 22' about a perimeter of the solder connection preform 20, with a height of about 0.1 μm to about 1 μm. It is preferred that the sidewall spacer 22' be below an upper surface of the solder connection preform 20, for reflow processes. As shown in FIG. 4, the sidewall spacers 22' remain directly on the passivation layer 16 and adjacent to the solder connection preform 20, due to the sequence of processing steps of the present invention.

Figure 5:
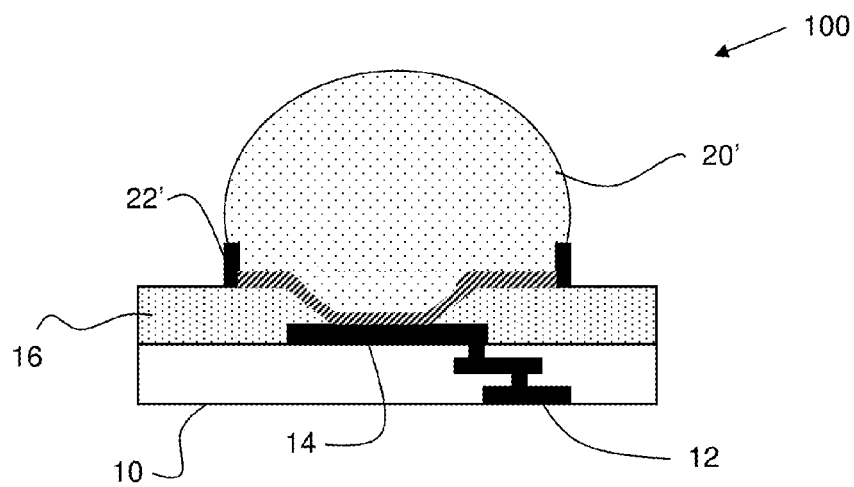

FIG. 5 shows reflow processes of the solder connection preform. By way of example, the reflow processes result in a solder bump 20', with the sidewall spacers 22' remaining directly about a perimeter of the solder bump 20'. The reflow processes can be about 260° C. for about 5 minutes, for a tin solder bump. It should be understood by those of ordinary skill in the art that other reflow temperatures and times are also contemplated by the present invention, depending on the material of the solder bump 20'. The wafer can then undergo a dicing process to form separate chips 100.

Figure 6:
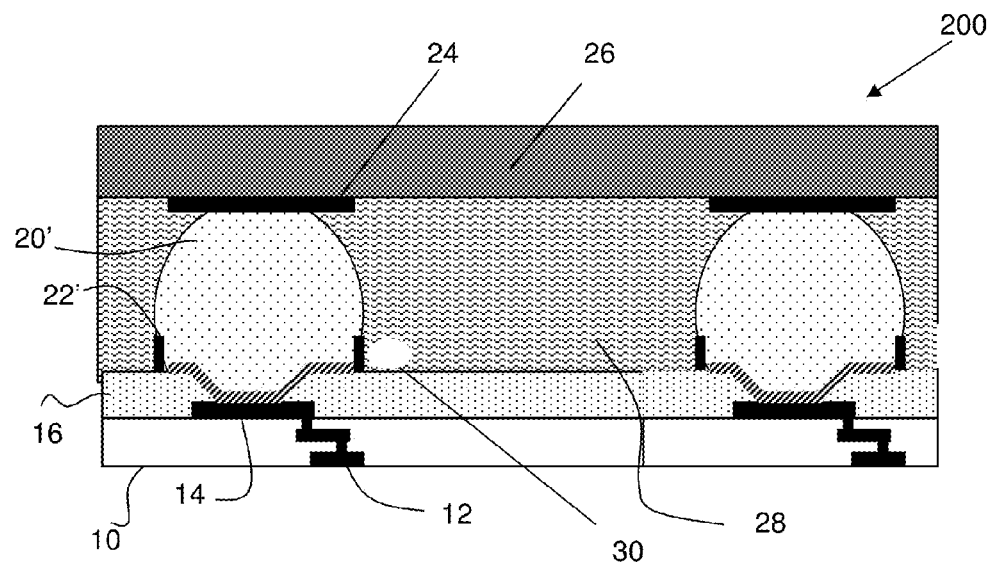

As shown in FIG. 6, the separate chips are packaged as represented by reference numeral 200. For example, a laminate 26 with a bond pad 24 is aligned with the solder bump 20'. The bond pad 24 is then connected (bonded) to the solder bump 20' using conventional packaging techniques. An underfill material 28 is formed within the package using conventional injection techniques. In embodiments, the underfill material 28 can be an epoxy which provides mechanical support for the solder bumps 20' and other structures.

As representatively shown, the injection of the underfill material 28 results in a void 30 adjacent to the solder bump

20'. This is due to poor adhesion between the underfill 28 and the on-chip passivation (polyimide) 16. The adhesion loss often occurs at the edge of solder bumps 20', due to a contamination of the polyimide surface 16 by the solder or due to a pre-existing void associated with the undercut of the BLM structure. Advantageously, the sidewall spacer 22' pinches-off the void 30 or covers up contaminated polyimide at the base of the solder bump 20', preventing neighboring solder connections, e.g., solder bumps 20' from shorting together.

Figure 7:
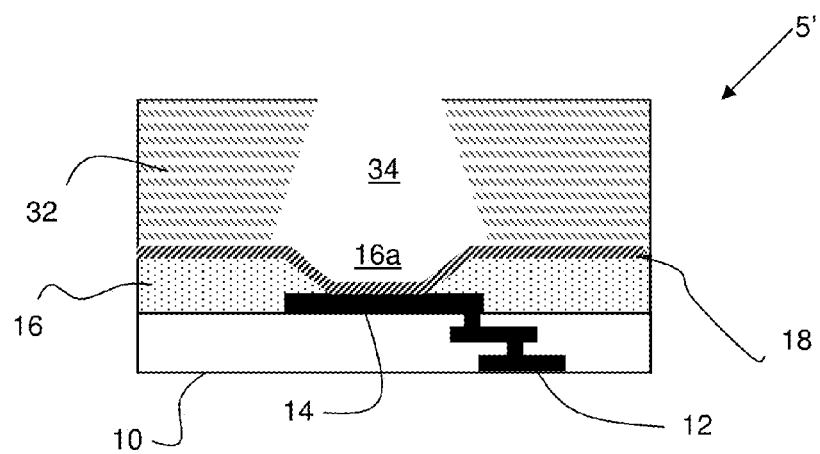
FIGS. 7-11 show processing steps and respective structures in accordance with additional aspects of the present invention.

FIGS. 7-11 show processing steps and respective structures in accordance with additional aspects of the present invention. More specifically, FIG. 7 shows a structure 5' comprising a chip 10. In embodiments, the chip 10 can include, for example, a number of wiring layers with active and passive components as represented by reference numeral 12 as already described herein. A bond pad 14 is formed on an upper surface of the chip 10, surrounded by a final passivation layer 16. In embodiments, the bond pad 14 can be, for example, any metal or metal alloy layer formed using deposition, lithography and etching processes. The final passivation layer 16 can be, for example, PSPI or other known passivation layers. Illustratively, the bond pad 14 can be formed by either a subtractive or additive process, well known to those of skill in the art.

A via 16a is formed in the final passivation layer 16 using conventional lithography and etching processes which expose the underlying bond pad 14. A BLM structure 18 is formed in then formed in the via 16a, in contact with the underlying bond pad 14. The BLM structure 18 can be a multilayer structure including, for example, TiW and Cu/Ni/Cu, formed using conventional deposition methods, e.g., PVD, lithography and etching (patterning processes). A resist 32 is formed on the BLM structure 18, which is patterned to form an opening 34 with an inverse taper. The opening 34 exposes the underlying BLM structure 18.

Figure 8:
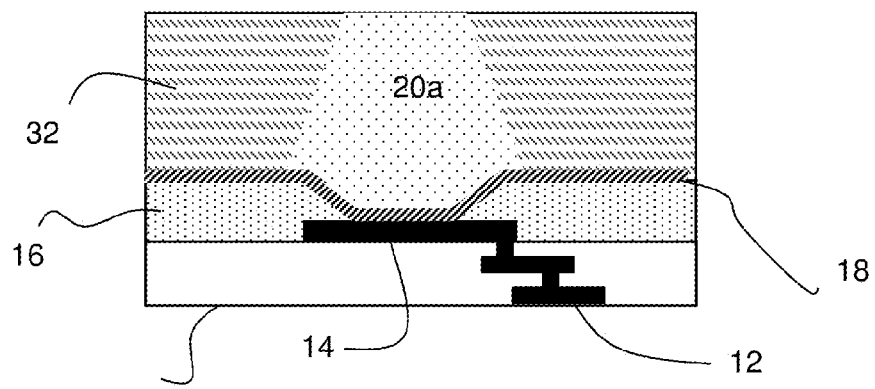

In FIG. 8, a solder connection preform 20a is formed within the inverse tapered opening 34 of the resist 32. The solder connection material can be formed to a height of about 50 µm; although other dimensions are also contemplated by the present invention. The solder connection material can be, for example, a lead free material such as tin formed using conventional electroplating techniques.

Figure 9:
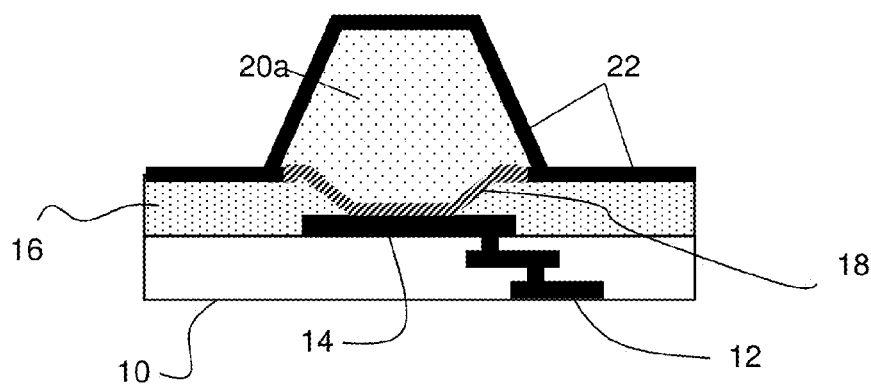

As shown in FIG. 9, the resist is removed using an oxygen ashing process, as one example. This process leaves a solder connection preform 20a with an inverse tapered profile. Any exposed BLM structure can be removed by a selective etching process, which leaves an exposed surface of the passivation layer 16. A sidewall material 22 is then formed on the inverse tapered solder connection preform 20a and any exposed portions of the passivation layer 16. In embodiments, the sidewall material can be deposited using conventional CVD processes. In more specific embodiments, the sidewall material 22 is a low temperature deposition of $SiO_2$ or SiN. The sidewall material 22 can be deposited to a thickness of about 50 nm to about 500 nm; although other dimensions are also contemplated by the present invention.

Figure 10:
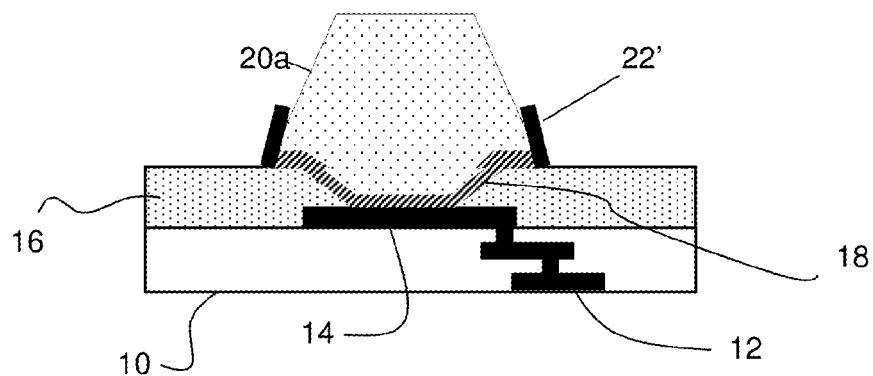

In FIG. 10, the sidewall material 22 is partially removed to form sidewall spacers 22'. In embodiments, the sidewall material is removed using an anisotropic etching process, prior to reflow of the solder connection preform 20a. The etching process will remove the sidewall material from all horizontal surfaces, e.g., horizontal surface of the solder connection preform 20a and passivation layer 16, and partially from the tapered surface of the solder connection preform 20a. As the solder connection preform 20a has a tapered profile, the etching process will be shorter than that discussed with regard to the structures shown in FIGS. 1-6.

In embodiments, the etching process will result in a sidewall spacer 22' having a height of about 0.1 µm to about 1 µm, and preferably only partially formed on the taped sidewall profile of the solder connection preform 20a. It should be understood, though, that depending on the etch time the sidewall material 22 will be removed from the tapered sidewalls of the solder connection preform 20a by a certain amount. In embodiments, the sidewall spacers 22' remain directly on the passivation layer 16 and adjacent to the solder connection preform 20a, due to the sequence of processing steps of the present invention.

Figure 11:
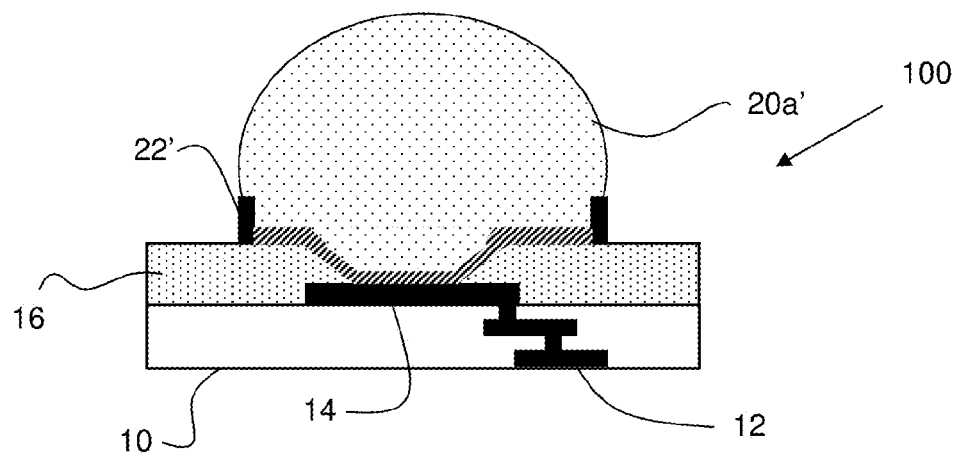

FIG. 11 shows reflow processes of the solder connection preform. By way of example, the reflow processes result in a solder bump 20a'. The reflow processes can be about 260° C. for about 5 minutes, for a tin solder bump; although other reflow temperatures and times are also contemplated by the present invention depending on the material use of the solder bump 20'. The wafer can then undergo a dicing process to form separate chips 100. The process continues to FIG. 6, as already discussed herein.

Figure 12:
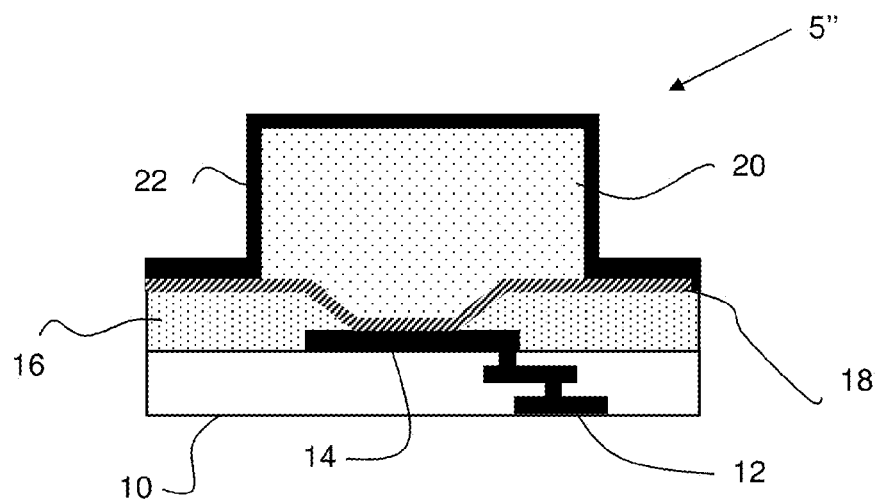
FIGS. 12-15 show processing steps and respective structures in accordance with yet additional aspects of the present invention.

FIGS. 12-15 show processing steps and respective structures in accordance with yet additional aspects of the present invention. More specifically, FIG. 12 shows a structure 5" comprising a chip 10. In embodiments, the chip 10 can include, for example, a number of wiring layers with active and passive components as represented by reference numeral 12. The active components can be, for example, transistors, diodes, etc.; whereas, the passive components can be, for example, wiring, vias, resistors, etc. The active and passive components 12 can be manufactured in accordance with well known CMOS fabrication techniques as described herein.

Still referring to FIG. 12, a bond pad 14 is formed on an upper surface of the chip 10, surrounded by a final passivation layer 16. In embodiments, the bond pad 14 can be, for example, any metal or metal alloy layer formed using deposition, lithography and etching processes. The final passivation layer 16 can be, for example, PSPI (Photosensitive Polyimide) or other known passivation layers. A via is formed in the final passivation layer 16 using conventional lithography and etching processes which expose the underlying bond pad 14. A BLM structure 18 is formed in the via, in contact with the underlying bond pad 14. The BLM structure 18 can be a multilayer structure as already described herein, formed using conventional deposition methods, e.g., CVD, lithography and etching processes (patterning processes).

FIG. 12 further shows a solder connection preform 20 formed on the BLM structure 18. In this embodiment, the solder connection preform 20 is patterned, prior to the patterning (partial removal) of the underlying BLM structure 18. The solder connection 20 can be formed using CMOS processes as already described herein. The solder connection can be a lead free material such as tin formed using conventional electroplating techniques. As in other embodiments, the solder connection material can be formed to a height of about 50 µm; although other dimensions are also contemplated by the present invention.

A sidewall material 22 is formed on the solder connection preform 20 and underlying BLM structure 18. In embodiments, the sidewall material 22 can be deposited using conventional CVD processes. In more specific embodiments, the sidewall material 22 is a low temperature deposition of $SiO_2$ or SiN. The sidewall material 22 can be deposited to a thickness of about 50 nm to about 500 nm; although other dimensions are also contemplated by the present invention.

Figure 13:
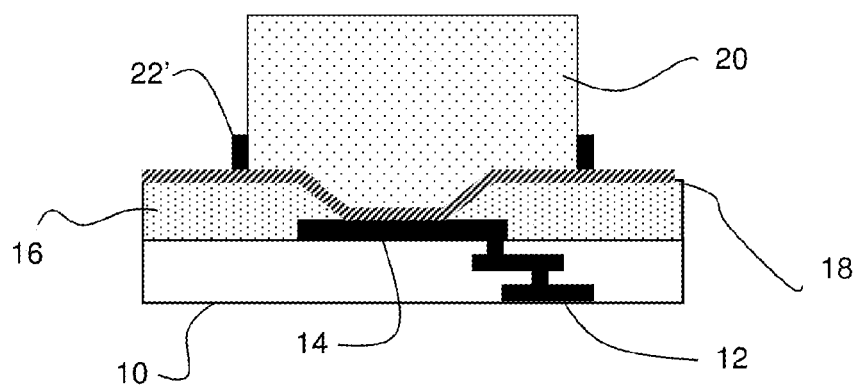

In FIG. 13, the sidewall material is partially removed to form sidewall spacers 22'. In this embodiment, the BLM structure 18 will protect the underlying passivation layer 16 during the selective removal of the sidewall material. By way of example, the sidewall material is removed using a selective anisotropic etching process, prior to the removal of the BLM structure 18 and reflow of the solder connection preform 20. As already described herein, the anisotropic etching process will remove the sidewall material from all horizontal surfaces, e.g., horizontal surface of the solder connection preform 20 and underlying BLM structure 18, and partially from the vertical surface of the solder connection preform 20. Depending on the etch time, the sidewall material will be removed from the vertical sidewalls of the solder connection preform 20 by a certain amount as already described herein, e.g., having a height of about 0.1 µm to about 1 µm. As shown in FIG. 13, the sidewall spacers 22' remain directly on BLM structure 18 and adjacent to the solder connection preform 20, due to the sequence of processing steps of the present invention.

Figure 14:
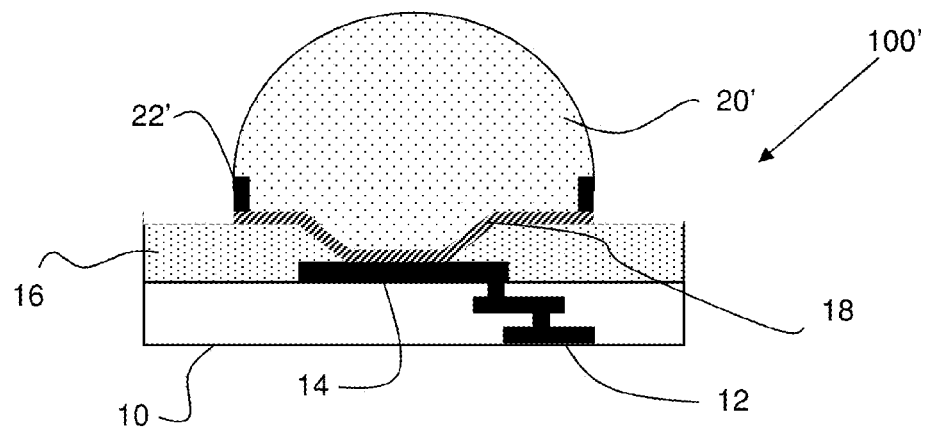

FIG. 14 shows the removal of portions of the BLM structure 18 and reflow processes of the solder connection preform. By way of example, any exposed BLM structure can be removed by a selective etching process. In embodiments, the selective etching process is a wet etch, selective to a metal. In this way, the selective etch process will not significantly damage the underlying passivation layer 16. Thereafter, the solder connection preform undergoes a reflow process to form a solder bump 20a. As described herein, the reflow processes can be about 260° C. for about 5 minutes, for a tin solder bump; although other reflow temperatures and times are contemplated by the present invention, depending on the material use of the solder bump 20'. The wafer can then undergo a dicing process to form separate chips 100'.

Figure 15:
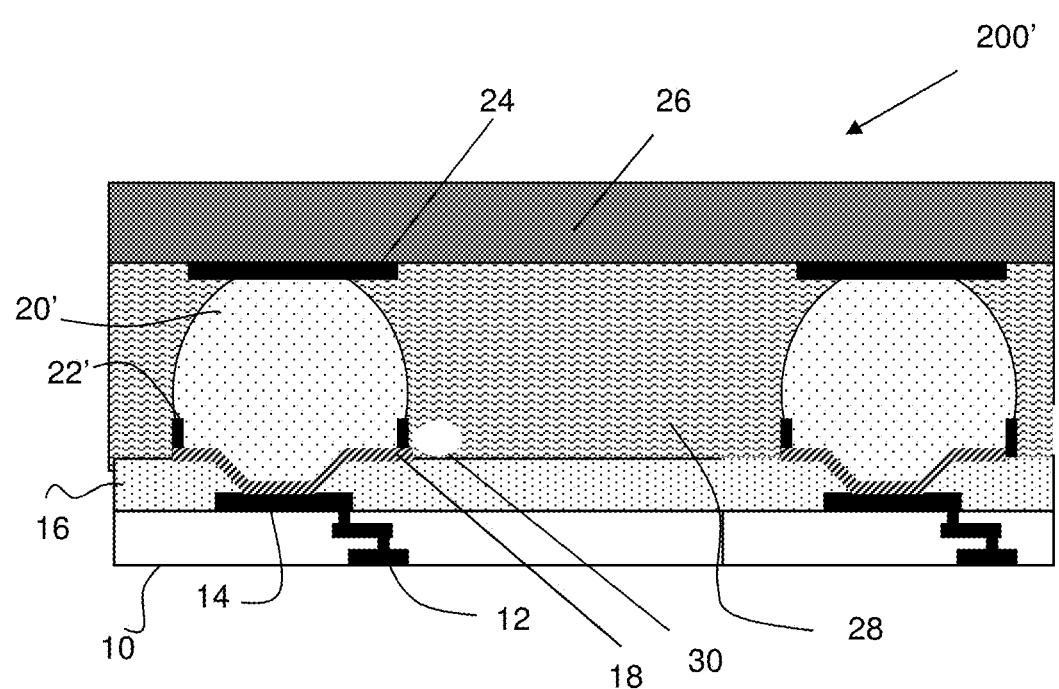

As shown in FIG. 15, the separate chips are then formed into package 200'. For example, a laminate 26 with a bond pad 24 is aligned with the solder bump 20'. The bond pad 24 is connected (bonded) to the solder bump 20' using conventional packaging techniques. An underfill material 28 is formed within the package using conventional injection techniques. In embodiments, the underfill material 28 can be an epoxy which provides mechanical support for the solder bumps 20' and other structures. As in all aspects of the present invention, advantageously, the sidewall spacer 22' pinches-off the void 30 or covers up contaminated polyimide at the base of the solder bump 20', preventing neighboring solder connections, e.g., solder bumps 20' from shorting together.

It should be understood by those of skill in the art that FIGS. 1-15 show various respective structures and related processing steps in accordance with various aspects of the present invention. As should be understood by those of skill in the art, each of the structures formed in FIGS. 1-15 can be fabricated using conventional CMOS processes as described herein. Also, any of the structures shown in FIGS. 1-15 can be provided in any combination. By way of example, the sidewall spacer 22' can be formed directly on the passivation layer 16 or the BLM structure 18, in any configuration of the solder connection preform, depending on the design parameters and specification of the integrated circuit.

Figure 16:
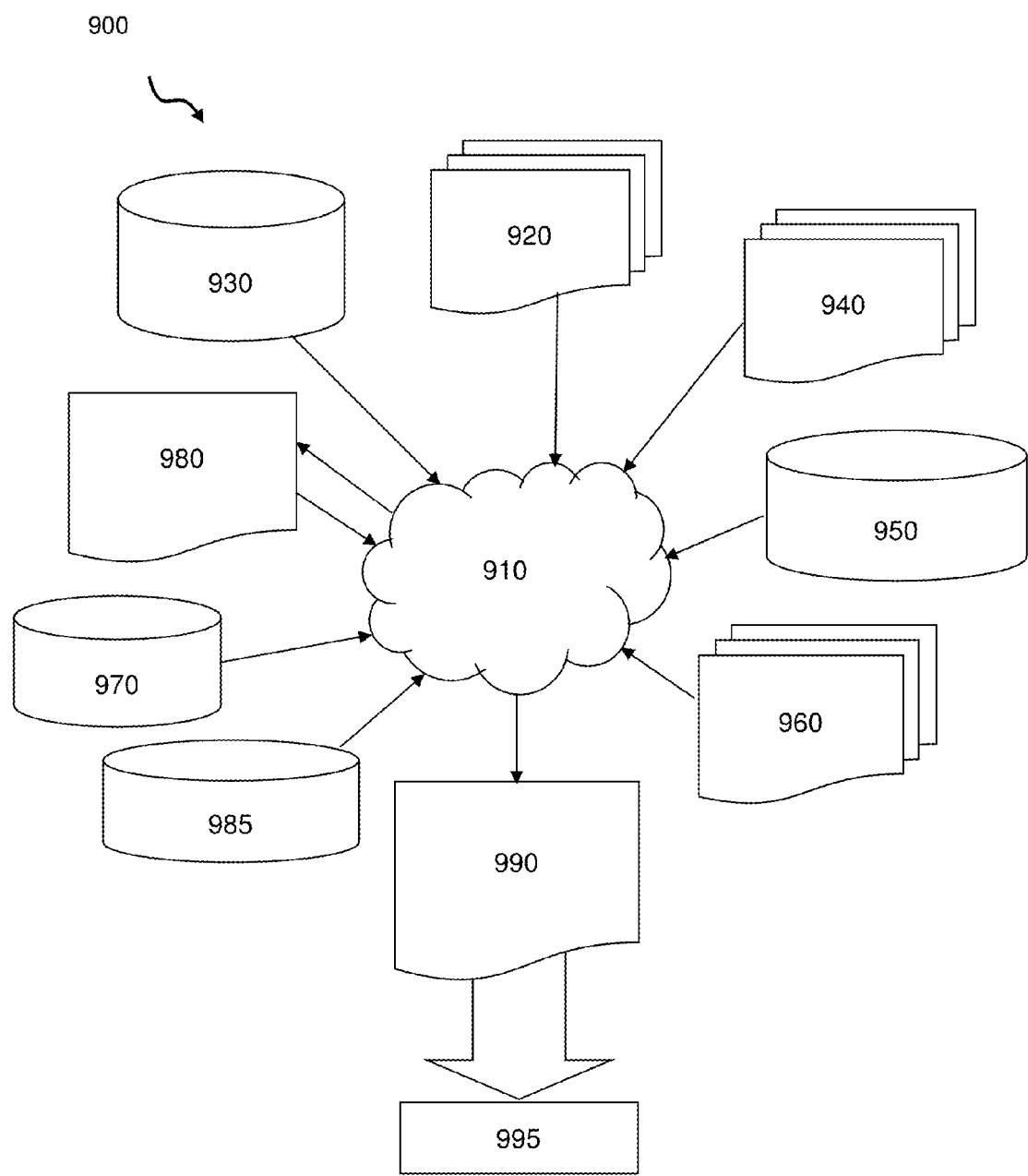
FIG. 16 is a flow diagram of a design process used in semiconductor design, manufacture, and/or test.

FIG. 16 is a flow diagram of a design process used in semiconductor design, manufacture, and/or test. FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 22 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15. In one embodiment, design structure 990 may comprise a compiled, executable HDL simulation model that functionally simulates the devices shown in FIGS. 1-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a solder preform connection on a bond pad of a chip;
    forming a spacer structure on sidewalls and an upper surface of the solder preform connection;
    removing the spacer structure from a top surface and upper portions of the sidewalls of the solder preform connection while leaving a portion of the spacer structure in contact with an underlying passivation layer;
    subjecting the solder preform connection to a predetermined temperature to form a solder bump, with the spacer structure remaining thereabout; and
    forming a packaged assembly by bonding the solder bump to a laminate and injecting underfill about the solder bump which forms a void adjacent to the spacer structure,
    wherein the spacer structure is structured and located to prevent extrusion of the solder bump within the void formed in the underfill, and the spacer structure is formed about a perimeter of the solder bump on a portion of the passivation layer underlying the solder bump, a ball metallization structure formed within a via of the passivation layer and in contact with the bond pad, and the solder bump.

2. The method of claim 1, wherein the spacer structure is formed adjacent to the solder bump on:
a ball metallization structure formed in contact with the bond pad; and
the solder bump.

3. The method of claim 2, wherein the forming of the spacer structure comprises:
forming the ball metallization structure within a via of a passivation layer;
depositing spacer material on the solder preform connection and the ball metallization structure;
removing the spacer material from the ball metallization structure, an upper surface of the solder preform connection and upper portions of sidewalls of the solder preform connection; and
removing exposed portions of the ball metallization structure from the passivation layer.

4. The method of claim 1, wherein the forming of the spacer structure comprises:
exposing the passivation layer by removing portions of the ball metallization structure;
depositing spacer material on the solder preform connection and the exposed portions of the underlying passivation layer; and
removing the spacer material from the exposed portions of the underlying passivation layer, the upper surface of the solder preform connection and the upper portions of the sidewalls of the solder preform connection.

5. The method of claim 4, wherein the solder preform connection has vertical sidewalls and the spacer material is removed from upper portions of the vertical sidewalls, prior to the forming of the solder bump.

6. The method of claim 4, wherein the solder preform connection has tapered sidewalls and the spacer material is removed from upper portions of the tapered sidewalls, prior to the forming of the solder bump.

7. The method of claim 4, wherein the spacer structure has a height of about 0.1 µm to about 1 µm.

8. The method of claim 4, wherein the spacer structure comprises one of SiN and $SiO_2$.

9. A method, comprising:
forming a ball metallization structure in contact with an underlying bond pad exposed through a via of a passivation layer;
forming a solder preform connection on the ball metallization structure;
forming spacer material on the solder preform connection and the passivation layer;
forming a spacer structure on sidewalls of the solder preform connection by removing portions of the spacer material from an upper surface of the solder preform connection and upper portions of the sidewalls of the solder preform connection while leaving a portion of the spacer structure in contact with the passivation layer;
forming a solder bump from the solder preform connection with the spacer structure remaining thereabout; and
forming a packaged assembly by bonding the solder bump to a laminate and injecting underfill about the solder bump which forms a void adjacent to the spacer structure,
wherein the spacer structure is structured and located to prevent extrusion of the solder bump within the void formed by the injecting of the underfill.

10. The method of claim 9, wherein the spacer structure is formed about a perimeter of the solder bump on:
a portion of the passivation layer underlying the solder bump;
an exposed portion of the ball metallization structure; and
the solder bump.

11. The method of claim 9, wherein the forming of the spacer structure is performed by a directional anisotropic etch.

12. The method of claim 9, wherein the forming of the spacer structure comprises:
depositing the spacer material on the solder preform connection and the ball metallization structure;
removing the spacer material from the ball metallization structure, the upper surface of the solder preform connection and upper portions of sidewalls of the solder preform connection; and
removing exposed portions of the ball metallization structure from the passivation layer.

13. The method of claim 12, wherein the removing the exposed portions of the ball metallization structure is performed by a wet etch process, selective to the ball metallization structure.

14. The method of claim 9, wherein the forming of the spacer structure comprises:
removing portions of the ball metallization structure to expose the passivation layer;
depositing the spacer material on the solder preform connection and the exposed portions of the passivation layer; and
removing the spacer material from the exposed portions of the underlying passivation layer, the upper surface of the solder preform connection and the upper portions of the sidewalls of the solder preform connection.

15. The method of claim 14, wherein the solder preform connection has vertical sidewalls and the spacer material is removed from upper portions of the vertical sidewalls, prior to the forming of the solder bump.

16. The method of claim 14, wherein the solder preform connection has tapered sidewalls and the spacer material is removed from upper portions of the tapered sidewalls, prior to the forming of the solder bump.

17. A method comprising:
forming a solder preform connection on a bond pad of a chip;
forming a spacer structure on sidewalls and an upper surface of the solder preform connection;
removing the spacer structure from a top surface and upper portions of the sidewalls of the solder reform connection while leaving a portion of the spacer structure in contact with an underlying passivation layer;
subjecting the solder preform connection to a predetermined temperature to form a solder bump, with the spacer structure remaining thereabout;
forming the bond pad on a substrate of the chip;
forming the passivation layer over the bond pad;
etching the passivation layer to expose an upper surface of the bond pad;
forming a ball limiting metallurgy on the upper surface of the bond pad and the passivation layer;
forming the solder preform connection directly on the ball limiting metallurgy;
forming a packaged assembly by bonding the solder bump to a laminate and injecting underfill about the solder bump which forms a void adjacent to the spacer structure, wherein the spacer structure is structured and located to prevent extrusion of the solder bump within the void formed by the injecting of the underfill; and wherein forming the spacer structure, comprises:
   forming spacer material on the sidewalls and the top surface of the solder preform connection; and
   removing the spacer material on the top surface and the upper portions of the sidewalls of the solder preform connection; and subjecting the solder preform connection to a predetermined temperature to form a solder bump, with the spacer structure remaining thereabout.

* * * * *